United States Patent
Little et al.

(10) Patent No.: US 9,391,380 B2
(45) Date of Patent: Jul. 12, 2016

(54) ELECTRICAL CABLE HARNESS AND ASSEMBLY FOR TRANSMITTING AC ELECTRICAL POWER

(71) Applicant: SunEdison, Inc., Maryland Heights, MO (US)

(72) Inventors: Ruel Davenport Little, Concord, MA (US); Zachary Adam King, Townsend (UA)

(73) Assignee: SunEdison, Inc., Maryland Heights, MO (US)

( * ) Notice: Subject to any disclaimer, the term of this patent is extended or adjusted under 35 U.S.C. 154(b) by 0 days.

(21) Appl. No.: 13/762,416

(22) Filed: Feb. 8, 2013

(65) Prior Publication Data

US 2013/0168131 A1   Jul. 4, 2013

Related U.S. Application Data

(63) Continuation of application No. 12/411,786, filed on Mar. 26, 2009, now Pat. No. 8,383,943.

(60) Provisional application No. 61/072,226, filed on Mar. 28, 2008.

(51) Int. Cl.
| | |
|---|---|
| *B65D 5/50* | (2006.01) |
| *H01B 7/00* | (2006.01) |
| *H02G 5/06* | (2006.01) |
| *H01R 9/22* | (2006.01) |
| *H01L 31/05* | (2014.01) |
| *H01R 24/84* | (2011.01) |
| *H02S 40/32* | (2014.01) |
| *H02S 40/36* | (2014.01) |

(52) U.S. Cl.
CPC ............. *H01R 9/226* (2013.01); *H01L 31/05* (2013.01); *H01R 23/27* (2013.01); *H02S 40/32* (2014.12); *H02S 40/36* (2014.12); *Y02E 10/50* (2013.01)

(58) Field of Classification Search
CPC .............................. H01L 31/04; H02M 7/003
USPC ........... 174/72 A; 307/82; 136/244; 439/505; 310/263
See application file for complete search history.

(56) References Cited

U.S. PATENT DOCUMENTS

| | | |
|---|---|---|
| 2,384,267 A | 9/1945 | Andersen |
| 3,671,918 A | 6/1972 | Mitchell |

(Continued)

FOREIGN PATENT DOCUMENTS

| | | | |
|---|---|---|---|
| DE | 25 29 258 A1 | | 10/1976 |
| EP | 1039361 A1 | * | 9/2000 |
| JP | 2003298100 A | * | 10/2003 |

OTHER PUBLICATIONS

European Search Report issued in European Application No. EP 09 72 4215 on Aug. 1, 2014, pp. 7.

*Primary Examiner* — Jose Gonzalez Quinone
(74) *Attorney, Agent, or Firm* — Armstrong Teasdale LLP

(57) ABSTRACT

An electrical connector/cable harness includes an electrically insulative housing and first and second passageways extending from a first end of the connector/cable harness to a second end thereof, first and second electrically conductive wires disposed in the passageways, respectively, wherein the passageways and the wires therein reverse their dispositions in the connector/cable harness such that at the second end of the connector/cable harness the two wires are disposed oppositely to their disposition at the first end of the connector/cable harness.

23 Claims, 13 Drawing Sheets

(56) References Cited

U.S. PATENT DOCUMENTS

| | | |
|---|---|---|
| 5,140,744 A | 8/1992 | Miller |
| 5,487,677 A | 1/1996 | Hoffner |
| D402,628 S | 12/1998 | Canuto et al. |
| 5,886,890 A | 3/1999 | Ishida et al. |
| 6,201,180 B1 | 3/2001 | Meyer et al. |
| 6,268,559 B1 * | 7/2001 | Yamawaki .................... 136/244 |
| 6,465,724 B1 | 10/2002 | Garvison et al. |
| 6,738,692 B2 | 5/2004 | Schienbein et al. |
| 6,750,391 B2 | 6/2004 | Bower et al. |
| 6,838,611 B2 | 1/2005 | Kondo et al. |
| 7,021,961 B1 | 4/2006 | Soderholm |
| 7,140,922 B2 | 11/2006 | Luu et al. |
| 7,153,170 B1 | 12/2006 | Fabian |
| 7,378,757 B2 | 5/2008 | Nakata |
| 7,406,800 B2 | 8/2008 | Cinnamon et al. |
| 7,855,473 B2 | 12/2010 | Fornage |
| 8,222,767 B2 | 7/2012 | Fornage |
| 2001/0023775 A1 | 9/2001 | Takada |
| 2002/0038667 A1 * | 4/2002 | Kondo ................... H02S 40/32 136/244 |
| 2003/0111103 A1 * | 6/2003 | Bower et al. .................. 136/244 |
| 2007/0013233 A1 * | 1/2007 | Belady et al. .................. 307/13 |
| 2007/0049107 A1 | 3/2007 | Su |
| 2007/0179720 A1 * | 8/2007 | Becker et al. .................. 702/58 |
| 2007/0221267 A1 * | 9/2007 | Fornage ........................ 136/244 |
| 2008/0283118 A1 * | 11/2008 | Rotzoll et al. ................. 136/251 |
| 2009/0084426 A1 | 4/2009 | Fornage et al. |
| 2009/0230782 A1 * | 9/2009 | Fornage ........................ 307/147 |

\* cited by examiner

ELECTRICAL CABLE HARNESS AND ASSEMBLY FOR TRANSMITTING AC ELECTRICAL POWER

CROSS-REFERENCE TO RELATED APPLICATIONS

This application is a continuation of U.S. patent application Ser. No. 12/411,786 filed Mar. 26, 2009, which claims the benefit of U.S. Provisional Patent Application No. 61/072,226 filed Mar. 28, 2008, the entire disclosures of which are incorporated herein by reference.

FIELD

The invention relates to assemblies for interconnecting AC generators and AC powered systems, and for converting solar energy to AC electrical power, and to electrical connector and cable harness means for interconnecting components of such assemblies.

BACKGROUND

Assemblies for converting DC sources of electrical energy, such as solar cells, batteries, and the like, to readily usable AC electrical power are known. However, current systems, particularly in the solar energy area, comprise a variety of components from multiple manufacturers. Such components in the solar energy area include photovoltaic cells, commonly referred to as solar cells, which convert solar energy to DC electrical power. Such cells are generally grouped in supporting and protective photovoltaic modules which are customarily mounted on roof tops, or other such structures, exposed to sunlight. The photovoltaic cells, and therefore, the photovoltaic modules, produce DC electrical power.

Usually, a number of photovoltaic modules are connected to an inverter which converts DC power output of the photovoltaic modules to AC power.

Photovoltaic systems usually include multiple DC photovoltaic modules connected in one or more series, or strings, feeding an inverter, which converts DC power to AC power. This system suffers from inefficiencies, such as module-to-module mismatch and power loss due to varying module orientations and significant shading losses. To connect one or more photovoltaic modules together to form a module string, there is provided a module cable harness including transmission wires and connector portions. A plurality of module and inverter strings may be connected to an AC buss by a module cable harness. The AC module buss may be connected to a junction box by a further cable harness with appropriate connector means.

The above described building blocks for photovoltaic power generating systems thus include DC generating photovoltaic modules, DC to AC inverters, DC and AC switches and other mechanical and electrical components.

Past AC modules have connected to a utility grid by utilization of an AC module cable harness which links AC module to AC module, functioning as both an AC physical string and an AC electrical buss.

The bussing of AC modules onto an AC power buss maintains the same AC voltage while it incrementally increases current with each AC module added. One or more strings/busses of AC modules are then connected to a combiner junction box to transition from the AC module cable harness to a runback wire to the service panel. The combiner junction box provides a terminal for transitioning the combined busses to a larger wire gauge and, optionally, overcurrent protection for each of the two AC busses.

The current state of the art for an AC module cable harness uses two, three-wire, quick connectors in the form of a male and female part and a three-wire cable connecting them. A single phase 120 volt AC module micro-inverter connects to the three-wire cable to make up the AC module buss. The micro inverter connects to line, neutral, and ground on the AC module buss.

In the current state of the art for two AC module strings connected to a combiner junction box, the two strings each are an AC module buss with a maximum of n modules. A standard AC module with a straight-through AC module cable harness connects to a combiner junction box in the center of two AC module strings of n modules.

AC modules must operate at the voltage of the grid to which they are interconnected. Typical USA residential and commercial grid services have available single-phase 120V, three-phase 120/208V, or split-phase 120/240V AC. It is desirable to have a product is operable on a 120V AC single phase line, because it is a universally available service voltage. In a residence, there is typically a split-phase 120/240V AC service available, consisting of two line conductors and a single neutral. The voltage between line and neutral is 120V AC. For typical commercial settings there is a three-phase 120/208V AC service that consists of three lines and a neutral. In this case, the voltage between a line and neutral is also 120V AC.

It also is desirable to connect as many AC modules on a single AC module string as possible, thereby avoiding additional junction boxes and service panel runback wires. In addition to adding cost, the junction box may require a roof penetration or may require a visible metal clad conduit, which installers try to minimize because of roof warranty issues and aesthetics.

The maximum number of AC modules on a buss depends on the AC module current rating, wire gauge and wire temperature rating. Higher temperature ratings and larger wire gauge increase the cost of the AC module cable harness. Therefore, as n increases, the cost of the AC module cable harness increases.

A limitation of the current AC module physical layout is that the junction box must be placed in a physical location that assures that it will accommodate the desired physical layout and electrical requirements of the AC module string This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

An object of the invention is to provide an electrical connector which may be disposed as a component of an assembly for converting solar energy to AC electrical power, and/or in a cable harness or system by which AC components are connected to each other.

A further object of the invention is to provide an electrical cable harness for interconnecting an AC power source, such as a DC photovoltaic module and inverter, or a battery and inverter, or a wind or water turbine AC generator, to an AC power assembly.

A still further object of the invention is to provide a power generating assembly including a plurality of the aforesaid AC modules in communication with a junction box, and a line-alternating cable harness assembly which facilitates the communication.

A still further object of the invention is to provide the aforesaid power generating assembly wherein selected components of the power generating assembly and the cable harness assembly and the junction box are provided with connector means configured to physically engage and interlock with complementary connector means, the connector means being configured so as not to engage with each other unless properly paired, such that such connectors, and thereby the other components of the system, cannot be inappropriately interconnected. Any of the connector/cable harness devices provided herein can be paired with any other like connector/cable harness and effect a correct connection for a buss.

The above and other objects and features of the invention, including various novel details of construction and combinations of parts, will now be more particularly described with reference to the accompanying drawings and pointed out in the claims. It will be understood that the particular device embodying the invention is shown by way of illustration only and not as a limitation of the invention. The principles and features of this invention may be employed in various and numerous embodiments without departing from the scope of the invention.

BRIEF DESCRIPTION OF THE DRAWINGS

Reference is made to the accompanying drawings in which are shown illustrative embodiments of the invention, from which its novel features and advantages will be apparent In the drawings.

Like reference symbols in the various drawings indicate like elements.

DETAILED DESCRIPTION

Figure 1:
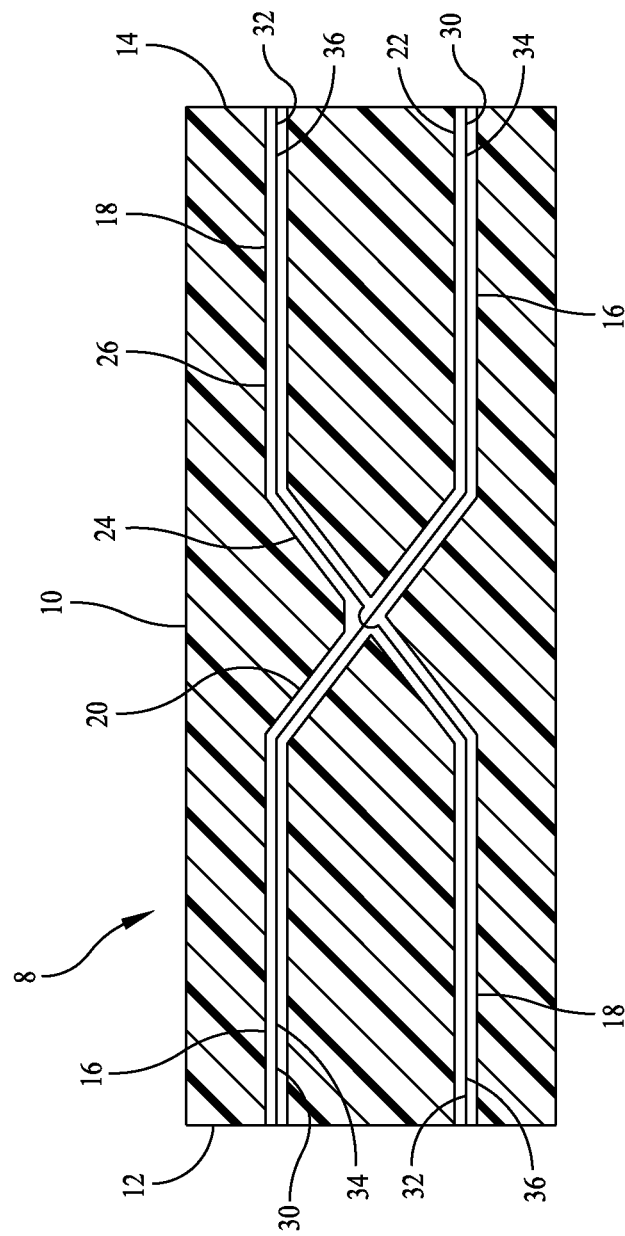
FIG. 1 is a diagrammatic sectional view of a cable harness housing having passageways extending therethrough, and electrically conductive wires disposed in the passageways.

Referring to FIG. 1, it will be seen that an electrical cable harness 8, suitable for interconnection of components of an assembly for converting solar power to AC electrical power, includes an electrically insulative housing 10 having first and second ends 12, 14. A plurality of passageways 16, 18 extend through the housing 10 from the first end 12 of the housing 10 to the second end 14 of the housing 10.

The first passageway 16, between the first and second connector ends 12, 14 of the housing 10, is provided with a first angled portion 20 extending to a portion 22 of the first passageway 16 in alignment with the second passageway 18 and extending to the second end 14 of the housing 10.

Similarly, the second passageway 18, between the first and second ends 12, 14 of the housing 10, is provided with a second angled portion 24 extending to a portion 26 of the second passageway 18 in alignment with the first passageway 16 and extending to the second end 14 of the housing 10.

A plurality of electrically conductive elongated bodies 30, 32 are disposed, respectively, in the plurality of passageways 16, 18 and extend through the housing 10 from the first end 12 of the housing 10 to the second end 14 of the housing 10, the electrically conductive bodies comprising at least the first and second electrically conductive bodies 30, 32.

Thus, at the second end 14 of the housing 10, the first and second passageways 16, 18 and therefore the first and second electrically conductive bodies 30, 32, are reversed in their positions relative to their dispositions at the first end 12 of the housing 10.

The electrically conductive bodies 30, 32 commonly comprise wires and may comprise a first line wire 34 and a second line wire 36, respectively.

Figure 1A:
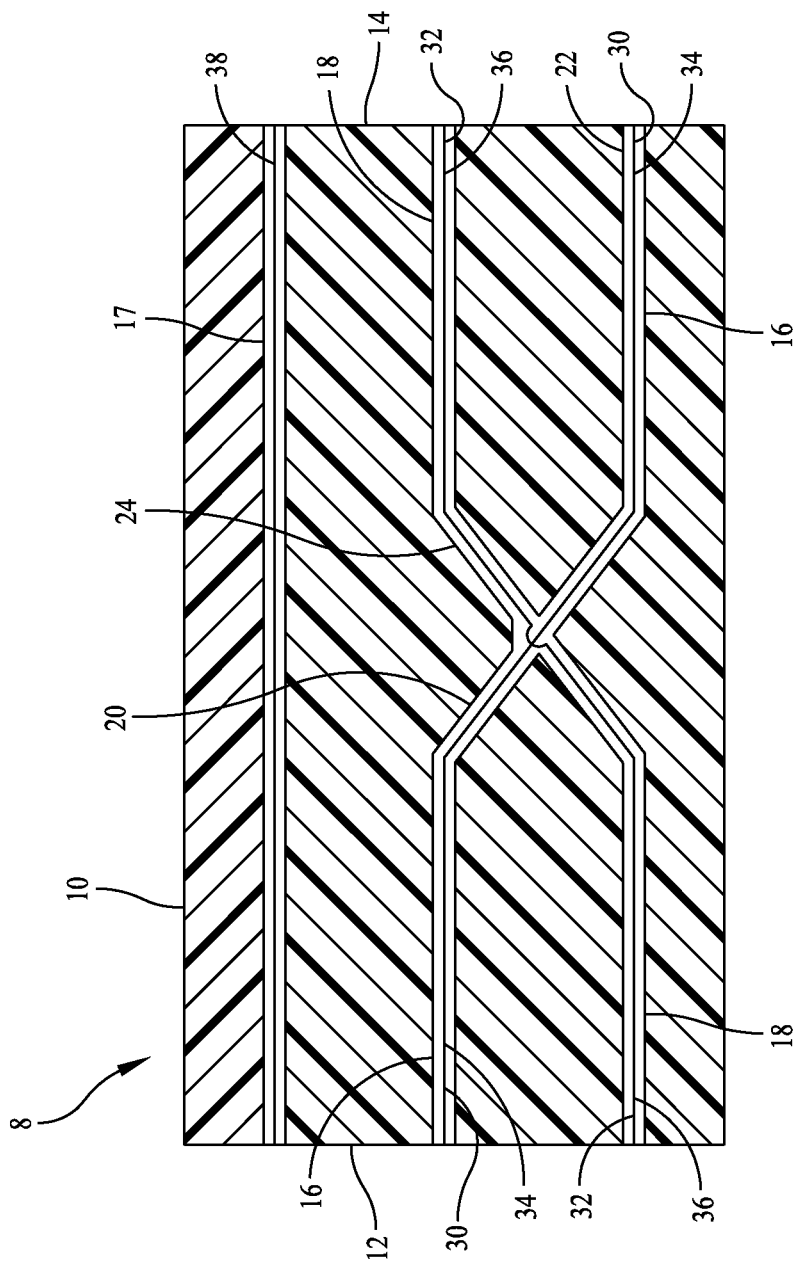
FIG. 1A is a diagrammatic sectional view similar to FIG. 1, but showing an additional passageway and electrically conductive wire extending therethrough.

Referring to FIG. 1A, it will be seen that the plurality of passageways and electrically conductive elongated bodies which extend through the housing 10 may include a third passageway 17, through which extends a neutral wire 38. The passageway 17 and neutral wire 38 extend through the housing 10 from end 12 to end 14 so as to occupy the same position at the second end 14 of the housing 10 as it does at the first end 12 of the housing.

Figure 1B:
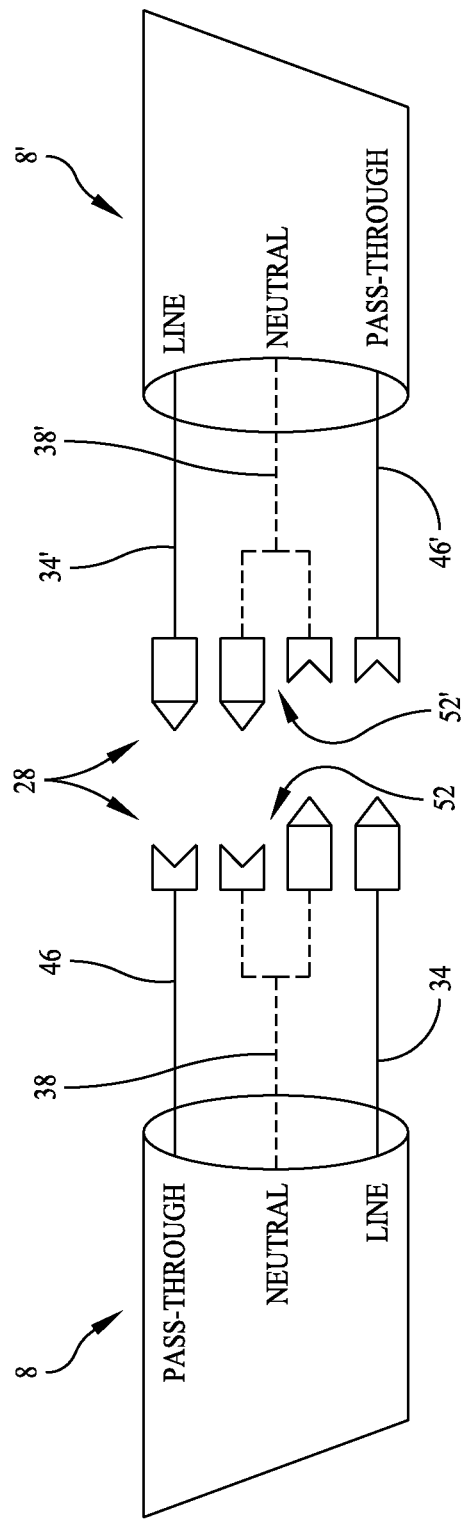
FIG. 1B is a wiring schematic of the embodiment of FIG. 1A, showing connector means by which cable harnesses may be interconnected.
Figure 1C:
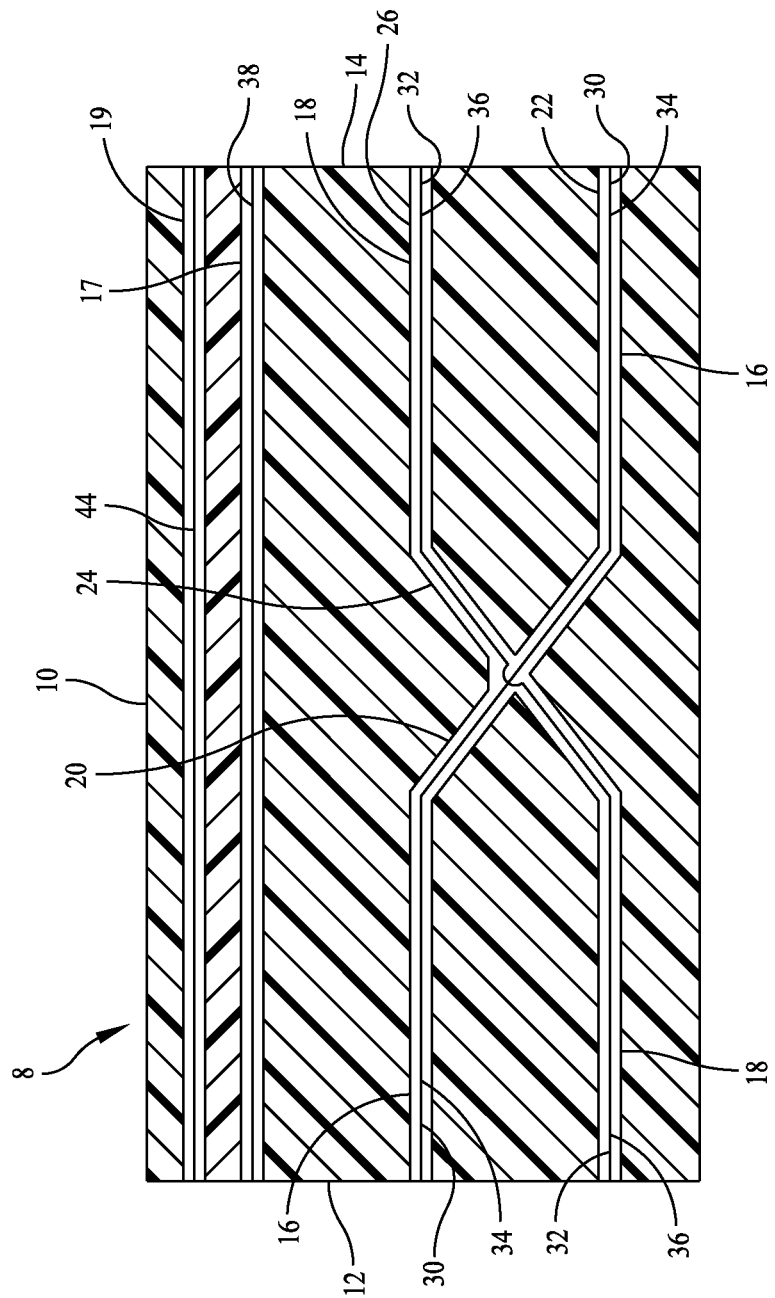
FIG. 1C is similar to FIG. 1A, but showing a further passageway and electrically conductive wire extending therethrough.
Figure 2:
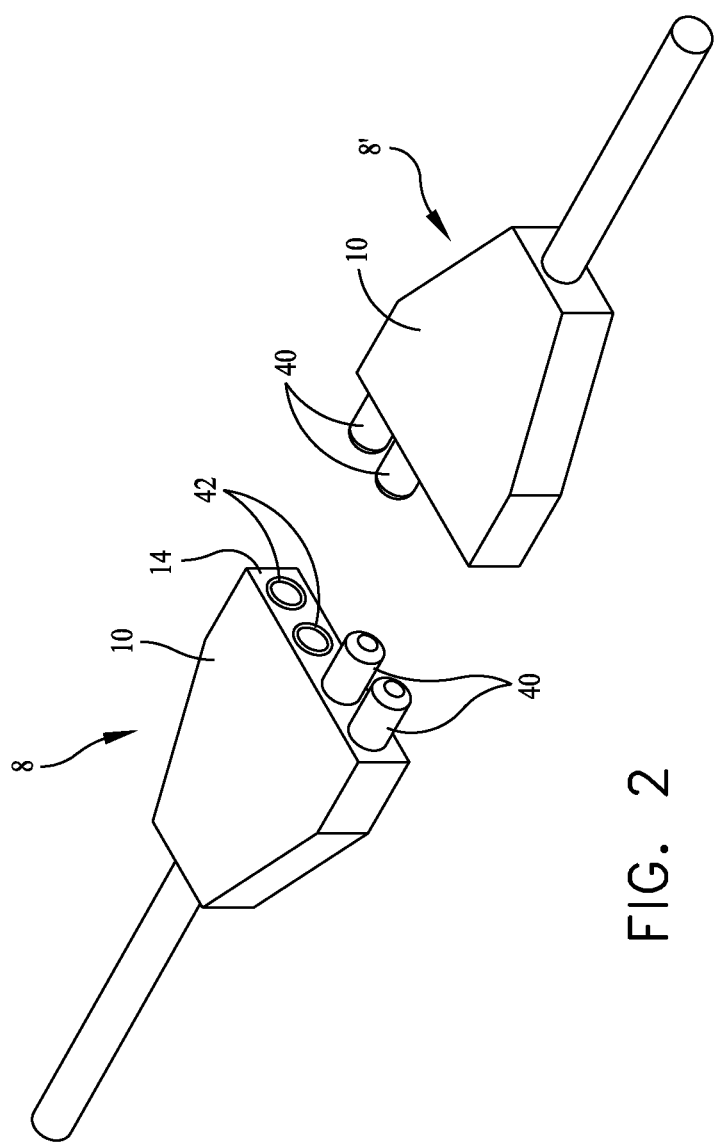
FIG. 2 is a perspective view of first and second cable harness connector means illustrative of a keying arrangement of connector contacts.

Similarly, and referring to FIG. 1C, it will be seen that the plurality of electrically conductive bodies which extend through the housing 10 may include a fourth passageway 19 in which there is disposed a ground wire 44. The passageway 19 and the ground wire 44 extend through the housing 10 from end 12 to end 14 so as to occupy the same position at the second end of 14 of the housing 10 as it does at the first end 12 of the housing.

As shown schematically in FIG. 1B, assuming that an AC power source is connected to the line wire 34 and neutral wire 38 of a connector means 28 of a cable harness 8, the pass-through wire 46 is not energized. The second connector means 8' is also connected to the line wire 34' and neutral wire 38' of an AC power source, and a pass-through wire 46' is not energized. When the connectors 28 are mated, the energized line 34 of the cable harness 8 mates to the pass-through wire

46' of the cable harness 8'. The opposite is true for the cable harness 8', its line wire 34' connecting to the pass-through wire 46 of cable harness 8.

As a result, two separate lines are created automatically, with a shared neutral wire, such that every other AC power source will be on the same line wire and adjacent AC power sources will be on the other line wire.

Each of the cable harness connector means is readily connectable to an identical connector means.

Referring to FIGS. 2 and 3A-3D, it will be seen that the housings 10 may be provided with electrically conductive male pins 40 and electrically conductive female pins 42 mounted thereon and connected to the wires 34, 36, 38 and 44 in known fashion. The pins 40, 42 are arranged such that cable harness connector means 28 are connectable to each other in only one orientation.

Figure 3:
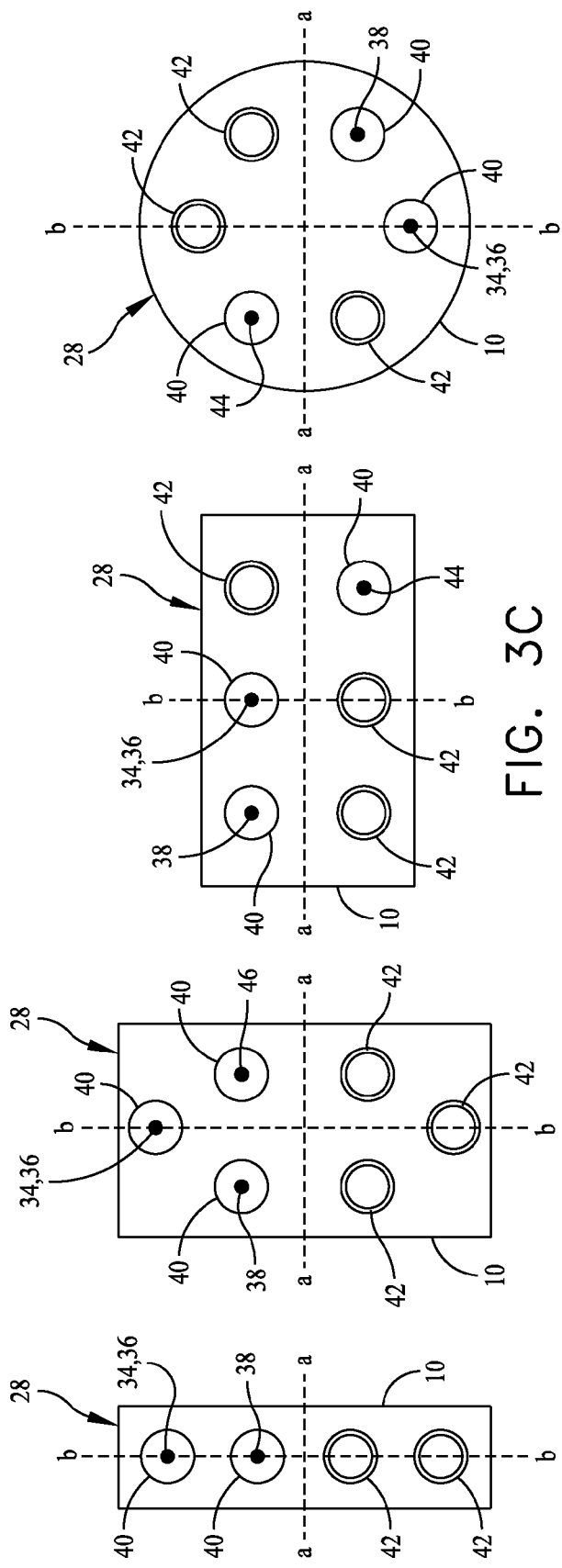
FIGS. 3A-3D show diagrammatically four configurations of connectors which have keying contacts insuring proper interconnection of connector means of cable harnesses.

In FIGS. 3B, 3C and 3D there are depicted other connector pin arrangements for three wire connectors, including for example, combinations of first and second line wires 34, 36, neutral 38 and ground 44 wires.

The connector pins 40, 42 are disposed on the connectors 8, 8' by gender, location and conductor designations, such as line wires 34, 36, which serve also as pass-through wires, as will be discussed hereinbelow, a neutral wire 38 and, optionally, a ground wire 44. The conductor pins 40, 42 of each cable harness connector 8, 8' are disposed symmetrically about two symmetry axes. In FIGS. 3A-3D, the first symmetry axis a-a is depicted by horizontal dashed lines and the second symmetry axis b-b by vertical dashed lines. Circles denote female conductor pins; circles with center dots denote male conductor pins.

The connector 28 is symmetrical about the first symmetry axis a-a which does not intersect any conductor pin 40, 42. The symmetry includes three attributes: location, gender (male, female) and designation (line, neutral, ground). A conductor pin 40 location is mirrored across the axis line a-a by a pin 42 of the opposite gender and of the same designation (i.e., line, neutral, ground).

The connector 28 is symmetrical about the second symmetry axis b-b, which is perpendicular to the first symmetry axis a-a, and which bisects line conductor pins 40, 42. A conductor pin 40, 42 location is mirrored across the second symmetry axis b-b by a pin 40, 42, wherein genders are opposites and designations are common.

The aforesaid symmetry insures that a connector 28 is physically able to mate to an identical connector that is rotated 180 degrees, and insures that conductors of proper designation are electrically connected.

A hermaphroditic "pin", as illustrated schematically in FIG. 1B, where the neutral wire connector pins 52, 521 are both male and female, may be used, but the symmetries still prevail.

Figure 4:
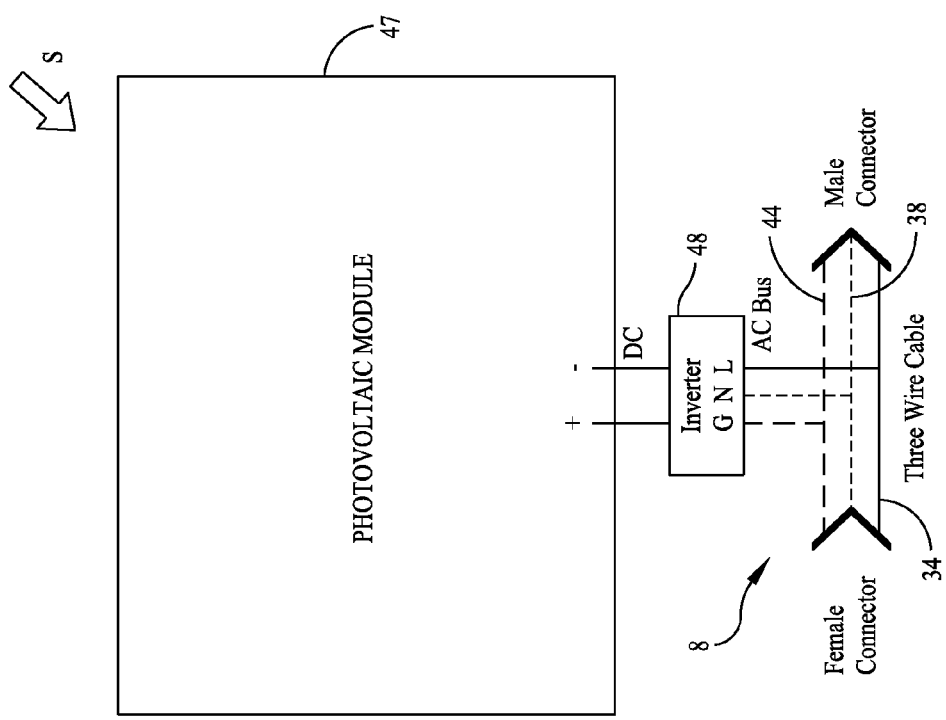
FIG. 4 is a schematic view of a prior art discrete DC photovoltaic module in communication with a discrete inverter which is in communication with a cable harness.

Referring to FIG. 4, it will be seen that customarily in the prior art, photovoltaic modules 47 (solar cells) are adapted for conversion of solar energy S to electrical power, more specifically direct current (DC). Inasmuch as usable power in households, businesses, and the like, is alternating current (AC), all such modules must be connected to an inverter 48 which converts DC energy to AC energy. Typically, a number of the solar cells 47 are in communication with an inverter 48. Thus, in planning roof-top dispositions of solar cells and inverters, they must be organized such that an appropriate number and disposition of inverters is allowed for an appropriate number and disposition of solar cells.

Figure 5:
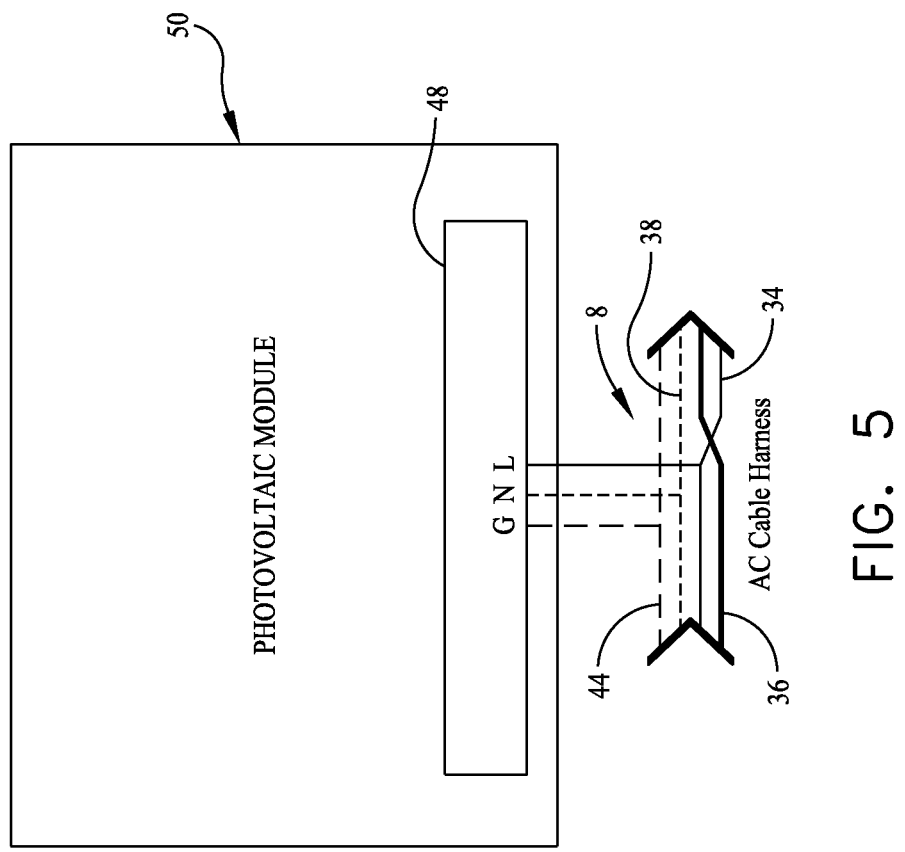
FIG. 5 is a schematic view of a photovoltaic module with a dedicated inverter, to form an AC module, shown in combination with an AC cable harness, as shown in FIG. 1B.

Referring to FIG. 5, it will be seen that in accordance with the present invention, each photovoltaic module includes a dedicated inverter 48, enabling any number and disposition of photovoltaic modules 50 where the inverters are physically matched with the locations of modules. Such combinations of modules and inverters are herein referred to as "AC modules" 50.

The AC module 50 is adapted for connection to a cable harness which may be provided with the wiring and cross-over feature illustrated in FIG. 1B. That is, the cross-over feature may be present in a cable harness, such that in the cable 8, the line wires 34 and 36 reverse relative positions as they pass through the cable harness.

Referring still to FIG. 5, it will be seen that in an AC module cable harness 8 provided with a line wire 34, a neutral wire 38, a second line wire 36 serving as a "pass-through" wire and, optionally, an earth ground wire 44, the electrical path for line wire 34 is switched with the pass-through wire 36. The cable harness 8 also is provided with means to connect the cable harness to the AC output (electrical line L, neutral N, and ground G) of an AC module 50.

Figure 6:
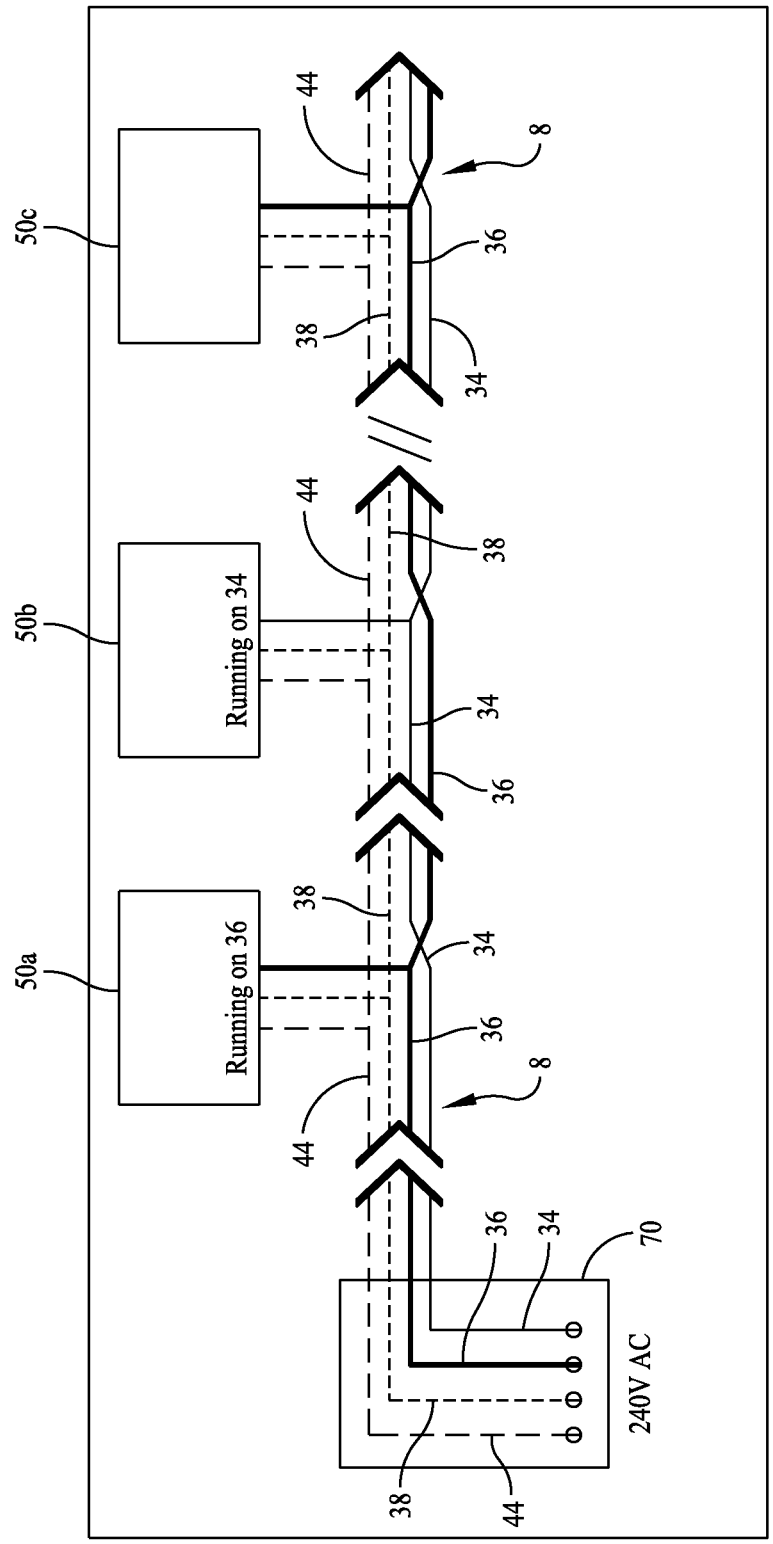
FIG. 6 is a schematic view of a string of AC modules in combination with cable harnesses, and in further cooperative combination with a junction box.

Referring to FIG. 6, there are shown a plurality of AC modules 50a, 50b, and 50c connected to a junction box 70. A ground wire 44, a neutral wire 38, and two line wires 34, 36 interconnect the junction box 70 and a selected number of AC modules 50a, 50b, and 50c, and any additional AC modules desired. The ground wire 44 and neutral wire 38 are in communication with each of the modules 50a, 50b, and 50c, etc. However, the connector means 8, 8' insure that only line wire 36 connects with modules 50a and 50c, and line wire 34 connects with the AC module 50b. That is, every other AC module connects with line wire 34 and each AC module therebetween connects with line wire 36. Thus, each line wire 34, 36 at every other module becomes a pass-through wire, such that each line wire services one-half of the modules 50 in a string of modules.

Thus, twice as many AC modules can be connected together without exceeding the wire current carrying limit of the cable harnesses and related wiring. The AC module string requires only a standard junction box that can be located at an end of the string.

The line-alternating feature assures that approximately half the AC modules 50 are supplying current to one line 34 in the cable harness 8 and the current from the other half of the AC modules is supplied current to the other line wire 36. Current is therefore balanced between the two AC lines 34, 36, unless there is an odd number of AC modules 50. In the case of an odd number of AC modules, there is a small current imbalance between the two lines 34, 36. However, the maximum amount of the imbalance is no greater than the current limit of one AC module. In addition, the current traveling on the neutral wire 38 is defined as the current imbalance, and therefore will be no greater than the current limit of one AC module. There is thus provided a line-alternating harness 8 that insures that current on its two lines 34, 36 is balanced to within the current limit of one AC module. The current on each line 34, 36 of the line-alternating cable harness 8 is thus evenly balanced without special action required by an installer, and the maximum current on the neutral wire 38 is the current limit of one AC module. Accordingly, the current on the neutral wire is minimized.

A feature of the line-alternating cable harness 8 is that in any two neighboring AC modules 50a, 50b connected to each other (FIG. 6) via a line-alternating cable harness 8, one of the modules will be connected to the line wire 34, and the other module will be connected to the line wire 36. An advantage of the line-alternating cable harness is that each AC module 50 can be manufactured, including the line-alternating cable harness 8, identically, while still maintaining the alternating pattern when connected together.

Thus, in a string of 2n AC modules 50*a*, 50*b*, etc., n of the modules will be connected to a first line, and n of the modules will be connected to a second line. When the line-alternating cable harness connects to a junction box 70 (FIG. 6), the line wire and pass-through wire are both 120V AC buss lines relative to the neutral line 38. The junction box 70 receives the two line wires 34, 36, neutral wire 38, and optionally a ground wire 44, and transitions directly to a 120/240V AC or 120/208V AC service. The junction box 70 can therefore accept two or more 120V AC module busses, with no need for overcurrent protection or transitioning to a larger gauge wire to a utility power service. Because each line in the line-alternating cable harness 8 can electrically carry the current for n AC modules, the total length of the AC module string can be 2n AC modules (FIG. 6).

A line-alternating cable harness that uses two line wires insures that each AC module added to an AC module string is connected to the opposite line from the previous AC module in the string, regardless of where the buss junction box is located or the presence of an extension cable in the string. Installers do not need specialized knowledge for connecting AC modules together in a string, or locating the junction box, thereby simplifying installations, reducing the cost and increasing the quality of installation.

The AC module 50 with a 120V AC output and a line-alternating cable harness can connect to either a 120/240V AC or a 120/208V AC standard junction box 70 at either end of the AC module string of up to 2n AC modules.

Figure 7:
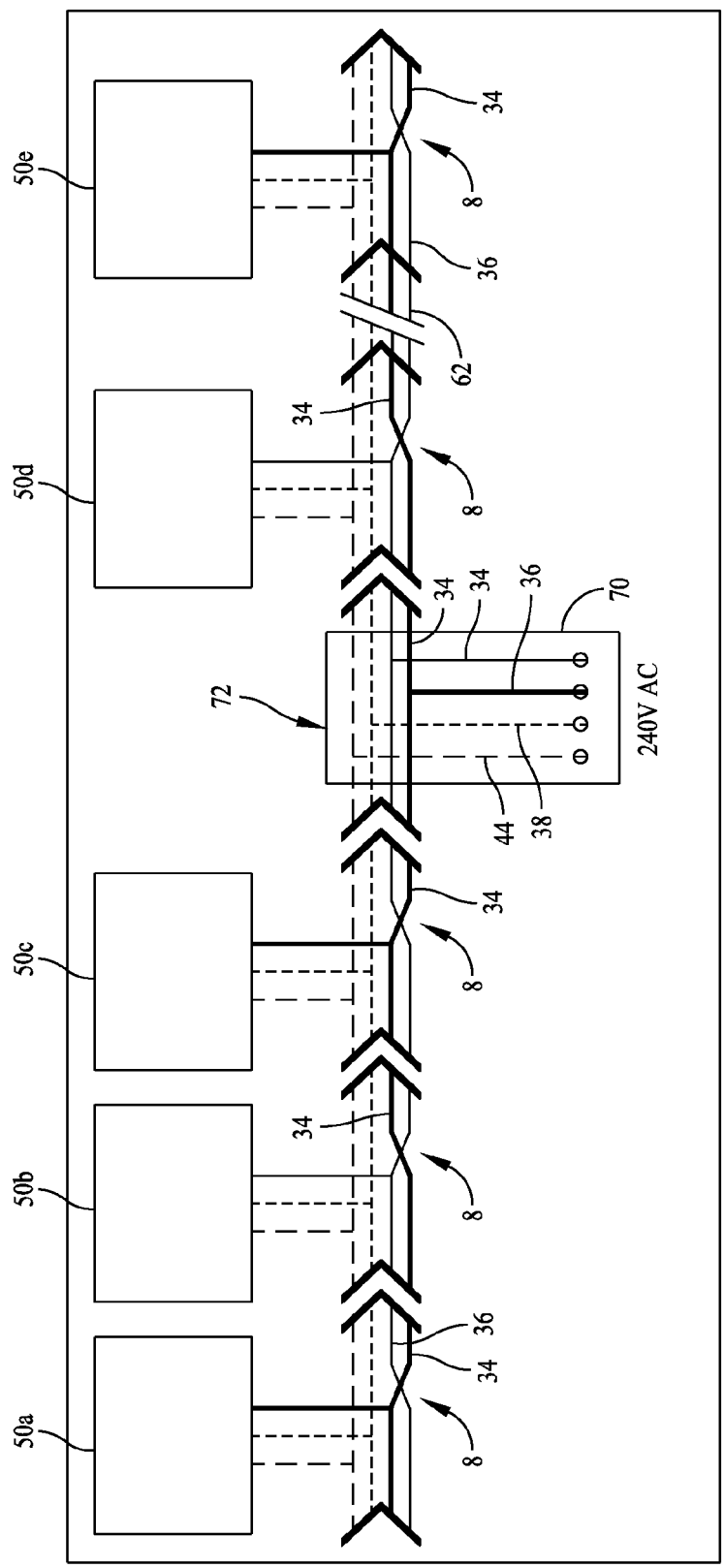
FIG. 7 is a schematic view of a plurality of strings of AC modules in combination with cable harnesses and a junction box.

If a further connector is added to the standard junction box to create a buss junction box, then the junction box can be located at either end of the AC module string or at any location in between any two AC modules 50*a*, 50*b*, 50*c*, 50*d*, 50*e* (FIG. 7). The buss junction box 70 passes the buss through, as at 72, thereby maintaining the alternating pattern of the two lines 34, 36. An installer need not keep track of how many AC modules are on a particular line, as the modules will be evenly balanced between both lines.

An AC module 50 and a line-alternating cable harness 8 is adapted to connect to a 240V AC or 208V AC (wye) buss junction box 70 at any position along the AC module string of up to 2n modules (FIG. 7), thus having the flexibility to position a new buss junction box anywhere in the AC module string. Overcurrent protection and transitioning to larger wire size are unnecessary.

In addition to a junction box inserted between two AC module strings, it is sometimes necessary to extend an AC module cable harness to connect to an AC module that is not physically nearby. This may occur, for example, if an AC module string must avoid an obstacle on a roof, or when one AC module string needs to connect to another row or column of AC modules.

Figure 8:
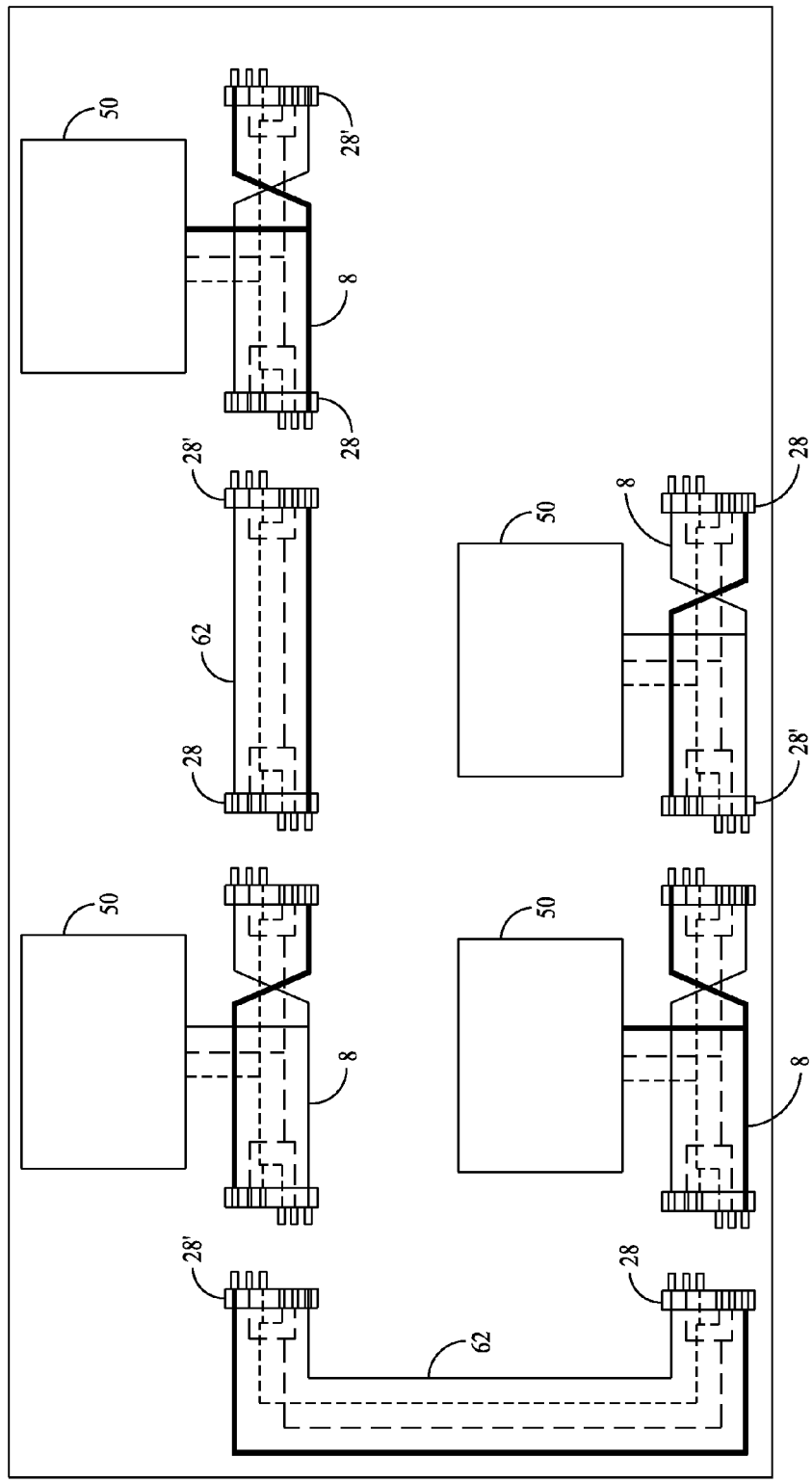
FIG. 8 is a schematic view of AC modules connected to one another by alternating line cable harnesses and by an extension cable.

An extension cable 62 (FIG. 8) for a line-alternating cable harness 8 consists of a cable with a connector means 28 at each end. Electrically, the extension cable 62 functions as a pass-through. That is, no line wires are crossed from the first connector means 28 to the second connector means 281 in the extension cable 62.

The benefit of the line alternating cable harness and junction box applies to a 208V AC-wye service connection, as well as a 240 volt service. The junction box 70, with 2n AC modules, may be connected to two of the three wires 34, 36, 44, as well as neutral wire 38 at, a service panel.

Figure 9:
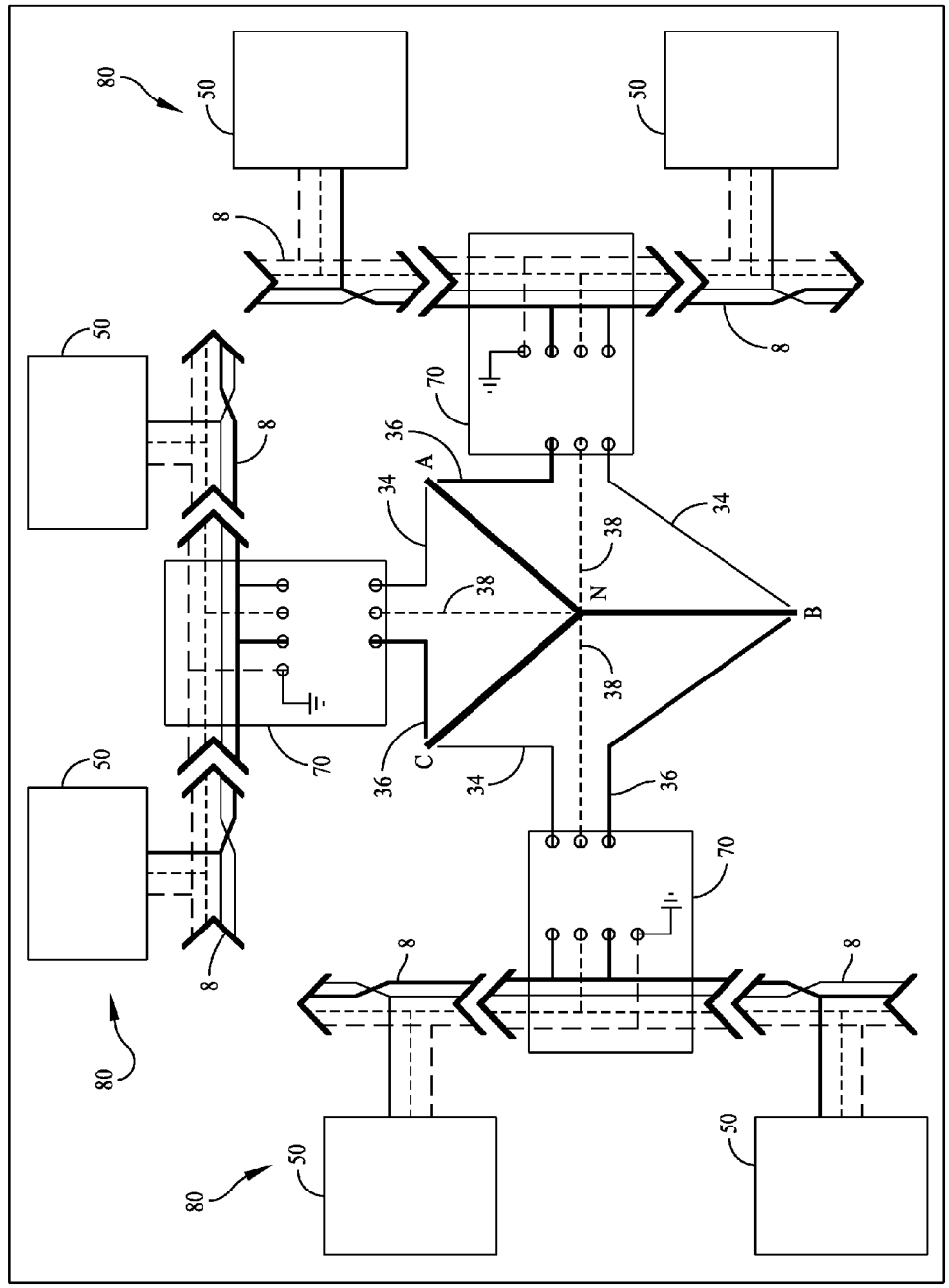
FIG. 9 is a schematic view of multiple strings of AC modules in combination with cable harnesses and junction boxes.

In FIG. 9 there is shown a three-phase 120/208V AC service, with three separate AC module busses 80, each comprising 2n AC modules 50. The line-alternating wiring harness 8 creates two 120V AC lines in each of three junction boxes 70. The output of each junction box 70 is then two lines 34, 36 and a neutral line 38. When each junction box connects to two separate legs of the three-phase service, a balanced connection is made with two 120 V AC module lines connected to each 120V leg of the three-phase service.

This benefit allows maximization of the current carrying capacity of a runback wire to a 208V AC service panel from three separated AC module strings 80 with 2n modules amounting to 6n AC modules. This is achieved by fully balancing the three AC lines using three buss or end junction boxes 70 from the AC module strings 80; one connected to service lines A and B, another to B and C and the third to C and A (FIG. 9).

Figure 10:
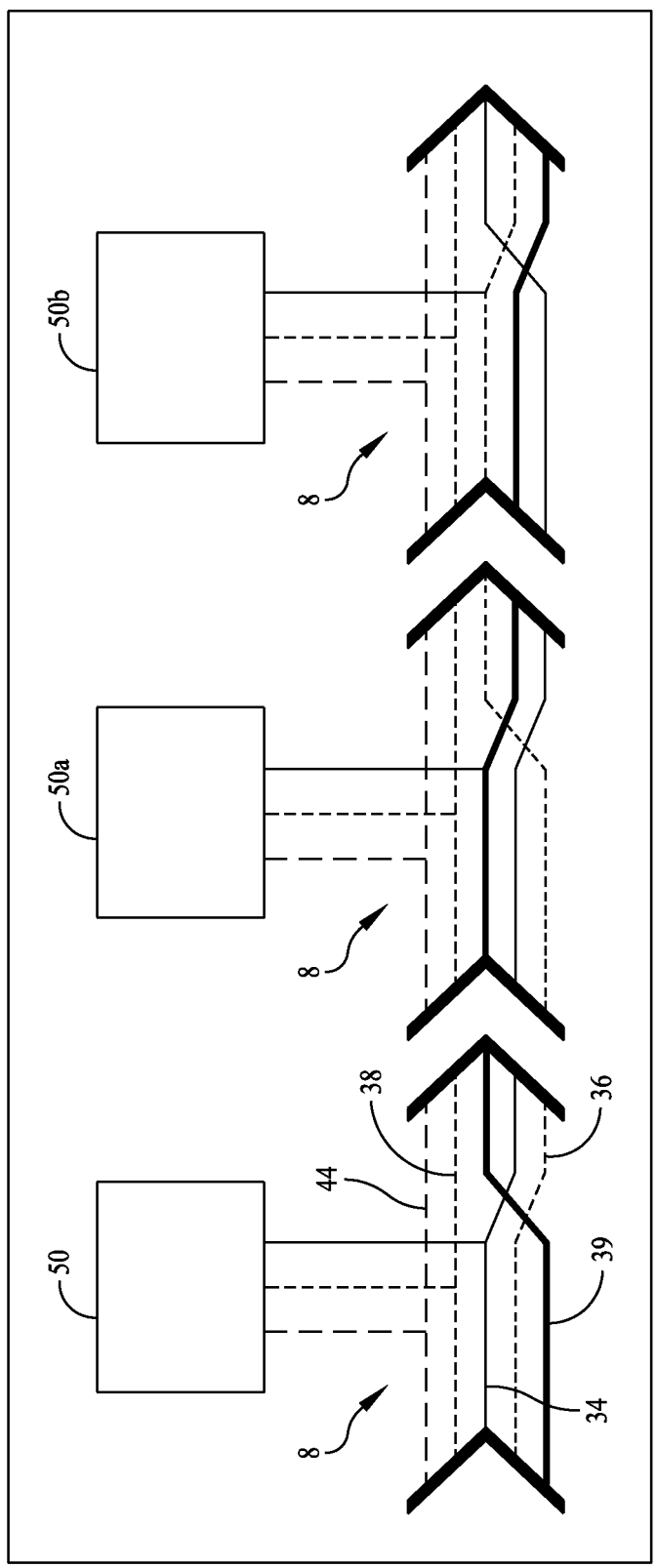
FIG. 10 is a schematic view of a string of AC modules and a five line alternating cable harness.

Another embodiment of the three phase 208V AC configuration is a three-line, line-alternating harness shown in FIG. 10. In each cable harness 8, there are two line wires 34, 36 and a third line wire 39 which crosses over the line wires 34, 36. This embodiment creates a pattern that alternates the three active lines 34, 36, 39 over three sequential AC modules 50, 50*a*, 50*b* and then repeats. A total of 3n AC modules may be in a string that transitions to a buss junction box 70. The junction box will then transition to a four-wire runback (including ground) that connects to three-wire 208V AC.

Thus, there is provided a line-alternating harness 8 that includes three line wires, 34, 36, 39 in an alternating pattern to create three 120V AC line outputs for use with a 208V AC-wye service. The current on each line of the 208VAC-wye service is evenly balanced within the output value of one AC module.

Accordingly, AC modules 50, 50*a*, 50*b*, etc., can be connected to one another with no consideration by an installer for connector means "gender". Furthermore, the combination creates a foolproof wiring method where the connection between an AC module 50, 50*a*, 50*b* and a junction box 70, or an AC module and an extension cable 62, will not break the pattern of the alternating lines. An installer, therefore, cannot create a hazardous connection along the AC buss or unbalance the AC buss. An AC module harness 8 is adapted to connect two or more AC modules in a row while maintaining the line-alternating feature.

While the cable harness/connector arrangement has been described hereinabove in conjunction with AC photovoltaic modules, it will be appreciated that the cable harness/connector is useful in conjunction with AC generators, such as wind and water turbines, and battery-inverter combinations.

It will be understood that many additional changes in the details, materials, steps and arrangements of parts, which have been herein described and illustrated in order to explain the nature of the invention, may be made by those skilled in the art within the principles and scope of the invention as expressed in the appended claims.

What is claimed is:

1. An alternating current (AC) module assembly comprising:
   a first string, a second string, and a third string of AC modules, each string comprising a plurality of AC modules connected by at least one wiring harness to provide a first phase power output and a second phase power output, each AC module comprising a photovoltaic module and an inverter;
   a first junction box, a second junction box, and a third junction box respectively coupled to the first string, the second string, and the third string to receive the first phase power output and the second phase power output of each of the first string, the second string, and the third string; and
   a service panel in electrical communication with the first junction box, the second junction box, and the third junction box to provide a three-phase power output at a first node, a second node, and a third node,
wherein the first phase power output and the second phase power output for the first string are respectively coupled to the first node and the second node, the first phase power output and the second phase power output for the second string are respectively coupled to the second node and the third node, and the first phase power output and the second phase power output for the third string are respectively coupled to the third node and the first node.

2. The AC module assembly of claim 1, wherein each string is configured to generate three phases of the three-phase power output.

3. The AC module assembly of claim 1 further comprising a fourth string of AC modules, wherein one of the first junction box, the second junction box and the third junction box coupled to the fourth string of AC modules.

4. The AC module assembly of claim 1, wherein one of the first junction box, the second junction box and the third junction box is coupled to a single string of AC modules.

5. A three phase photovoltaic (PV) system comprising:
at least one string of alternating current (AC) modules, the string comprising at least three AC modules, each AC module comprising a PV module and an inverter configured to receive direct current (DC) power from the PV module and output AC power;
a plurality of substantially identical cable harnesses, each cable harness connected to a different one of the AC modules and at least one other cable harness, each cable harness comprising:
a first connector including a plurality of conductor pins;
a second connector substantially identical to the first connector and including a plurality of conductor pins; and
a plurality of electrically conductive wires extending between the first and second connectors and electrically connected to the conductor pins of the first and second connectors, said electrically conductive wires including at least a first wire, a second wire, a third wire, and a fourth wire, wherein at least two of the first, second and third wires are each electrically connected to a different connector contact at the second connector than the connector contact to which it is connected at the first connector, and the fourth wire is electrically connected to the same conductor pins at the first and second connector;
wherein each AC module is connected to the same ones of the first, second, third, and fourth wires of its cable harness;
at least one junction box coupled to the cable harnesses and configured to receive the AC power from the AC modules and provide a three phase AC output; and
a service panel in electrical communication with the at least one junction box, wherein the service panel is configured to provide a three phase AC output, wherein the at least one string of AC modules comprises a first string, a second string, and a third string of AC modules, wherein the at least one junction box is coupled to the first string, the second string, and the third string to receive a first phase power output and a second phase power output of each of the first string, the second string, and the third string.

6. The three phase PV system of claim 5, wherein each AC module is connected to at least two of the first, second, and third wires of its cable harness at a location between the first connector and a location at which the first, second and third wires change positions.

7. The three phase PV system of claim 5, wherein the inverter of each AC module is configured to output at least two phases of AC power.

8. The three phase PV system of claim 5, wherein the inverter of each AC module is configured to output a nominal 208 volts of AC power.

9. The three phase PV system of claim 5, wherein the string of AC modules comprises multiples of three AC modules.

10. The three phase PV system of claim 5, wherein the at least one junction box is configured to provide a three phase 120/208 volt output.

11. The three phase PV system of claim 5, wherein the second connector is substantially identical to the first connector.

12. The three phase PV system of claim 5, wherein each AC module is connected to the same ones of the first, second, and third wires of its cable harness at a location between the first connector and the location at which the first, second and third wires change position.

13. A three phase photovoltaic (PV) system comprising:
a first string, a second string, and a third string of alternating current (AC) modules, each string comprising a plurality of AC modules and a wiring harness, each AC module including a PV module and an inverter coupled to the PV module and configured to output a single phase AC power, wherein respective wiring harnesses for the first string, the second string, and the third string of AC modules are substantially identical, and outputs of the first string, the second string, and the third string are each a two phase AC power output and the two phase AC power output of each string comprises a first phase power output and a second phase power output;
a service panel coupled to the respective wiring harnesses for the first string, the second string, and the third string of AC modules and configured to output a three phase AC power, wherein the service panel is configured to output the three phase power at a first node, a second node, and a third node.

14. The three phase PV system of claim 13, wherein the respective wiring harnesses each comprise a first connector, a second connector, and a plurality of electrical conductors extending between the first and second connectors, and wherein at least two of the plurality of electrical conductors in each wiring harness change relative positions between the first and second connectors.

15. The three phase PV system of claim 13, wherein outputs of the first string, the second string, and the third string are each a three phase AC power output including the first phase power output, the second phase power output, and a third phase power output.

16. The three phase PV system of claim 15, wherein the respective wiring harnesses each comprise a first connector, a second connector, and a plurality of electrical conductors extending between the first and second connectors, and wherein at least three of the plurality of electrical conductors in each wiring harness change relative positions between the first and second connectors.

17. The three phase PV system of claim 13, further comprising at least one junction box coupled between the first string, the second string, and the third string of AC modules and the service panel.

18. The three phase PV system of claim 17, wherein the at least one junction box includes a first junction box, a second junction box, and a third junction box respectively coupled to the first string, the second string, and the third string of the AC modules.

19. The three phase PV system of claim 13, wherein the plurality of AC modules includes a first group of AC modules configured to output the first phase power output, a second group of AC modules configured to output the second phase power output different from the first phase power output, and a third group of AC modules configured to output a third phase power output different from the first phase power output and the second phase power output.

20. The three phase PV system of claim 19, wherein the first, second, and third groups of AC modules each comprise a same number of AC modules.

21. The three phase PV system of claim 5, wherein the service panel is configured to provide the three phase AC output at a first node, a second node, and a third node, wherein the first phase power output and the second phase power output for the first string are respectively coupled to the first node and the second node, the first phase power output and the second phase power output for the second string are respectively coupled to the second node and the third node, and the first phase power output and the second phase power output for the third string are respectively coupled to the third node and the first node.

22. The three phase PV system of claim 21, wherein the at least one junction box comprises a first junction box, a second junction box, and a third junction box respectively coupled to the first string, the second string, and the third string.

23. The three phase PV system of claim 13, wherein the first phase power output and the second phase power output for the first string are respectively coupled to the first node and the second node, the first phase power output and the second phase power output for the second string are respectively coupled to the second node and the third node, and the first phase power output and the second phase power output for the third string are respectively coupled to the third node and the first node.

* * * * *